United States Patent
Matsuda et al.

(10) Patent No.: US 10,098,264 B2
(45) Date of Patent: Oct. 9, 2018

(54) AIR-CONDITIONING APPARATUS

(71) Applicant: FUJITSU LIMITED, Kawasaki-shi, Kanagawa (JP)

(72) Inventors: Takehisa Matsuda, Kawasaki (JP); Akira Minegishi, Setagaya (JP); Hideo Kubo, Kawasaki (JP); Hiroyuki Fukuda, Yokohama (JP); Toshio Sugimoto, Atsugi (JP); Masaki Takahashi, Hachioji (JP); Syunsuke Ohga, Chiba (JP)

(73) Assignee: FUJITSU LIMITED, Kawasaki (JP)

( * ) Notice: Subject to any disclaimer, the term of this patent is extended or adjusted under 35 U.S.C. 154(b) by 69 days.

(21) Appl. No.: 15/064,118

(22) Filed: Mar. 8, 2016

(65) Prior Publication Data
US 2016/0192543 A1    Jun. 30, 2016

Related U.S. Application Data

(63) Continuation of application No. PCT/JP2014/072315, filed on Aug. 26, 2014.

(30) Foreign Application Priority Data

Sep. 13, 2013    (JP) .................... 2013-190362

(51) Int. Cl.
*H05K 7/20* (2006.01)
*F24F 11/30* (2018.01)
(Continued)

(52) U.S. Cl.
CPC .......... *H05K 7/20836* (2013.01); *F24F 11/30* (2018.01); *F24F 11/76* (2018.01);
(Continued)

(58) Field of Classification Search
CPC .......... H05K 7/20836; H05K 7/20736; F24F 11/0012; F24F 11/053; F24F 11/76;
(Continued)

(56) References Cited

U.S. PATENT DOCUMENTS

| | | | |
|---|---|---|---|
| 2008/0055850 A1* | 3/2008 | Carlson | ................... G06F 1/20 361/695 |
| 2009/0171512 A1* | 7/2009 | Duncan | ................ F24F 5/0035 700/300 |

(Continued)

FOREIGN PATENT DOCUMENTS

| | | |
|---|---|---|
| JP | 7-35369 | 2/1995 |
| JP | 2005-260148 | 9/2005 |

(Continued)

OTHER PUBLICATIONS

International Search Report dated Dec. 2, 2014, in corresponding International Application No. PCT/JP2014/072315.

*Primary Examiner* — Raheena R Malik
(74) *Attorney, Agent, or Firm* — Staas & Halsey LLP (57) ABSTRACT

An air-conditioning apparatus is an air-conditioning apparatus, for an air-conditioning target space in which a rack including a device as a heat-producing object is provided and which is separated by the rack into a cold space and a hot space, that makes return air from the hot space flow in so as to cool the return air and supplies an arbitrary air volume of the supplied air which is obtained by cooling the return air to the cold space by using a supply fan. The air-conditioning apparatus includes a processor. The processor executes a process including conducting control so that a temperature of the supplied air is equal to a prescribed value that is set in advance, and adjusting an air volume of the supplied air by controlling the supply fan so that a temperature of the return air is equal to a target value that is set in advance.

3 Claims, 6 Drawing Sheets

(51) Int. Cl.
*F24F 11/76* (2018.01)
*F24F 11/00* (2018.01)
*F24F 110/10* (2018.01)
*F24F 110/30* (2018.01)
*F24F 110/40* (2018.01)
*F24F 120/20* (2018.01)
*F24F 11/61* (2018.01)

(52) U.S. Cl.
CPC .......... *H05K 7/20736* (2013.01); *F24F 11/61* (2018.01); *F24F 2011/0006* (2013.01); *F24F 2110/10* (2018.01); *F24F 2110/30* (2018.01); *F24F 2110/40* (2018.01); *F24F 2120/20* (2018.01)

(58) Field of Classification Search
CPC ........ F24F 11/30; F24F 11/61; F24F 2120/20; F24F 2110/30; F24F 2110/40; F24F 2110/10; F24F 2011/0006
USPC .......................................................... 165/246
See application file for complete search history.

(56) References Cited

U.S. PATENT DOCUMENTS

| | | | | |
|---|---|---|---|---|
| 2010/0330896 A1* | 12/2010 | Ohba | ................... | F24F 11/0001 454/184 |
| 2011/0127027 A1* | 6/2011 | Kashirajima | ........... | F24F 3/065 165/286 |
| 2011/0306287 A1* | 12/2011 | Takagi | ................. | F24F 11/0079 454/184 |
| 2012/0272669 A1* | 11/2012 | Blanton | .................... | F25B 5/02 62/89 |
| 2013/0091881 A1* | 4/2013 | Ito | ...................... | H05K 7/20836 62/119 |
| 2013/0154135 A1* | 6/2013 | Yoshida | ................ | F24F 3/1423 261/161 |
| 2013/0233532 A1* | 9/2013 | Imwalle | .................. | F28F 27/02 165/287 |
| 2015/0116929 A1* | 4/2015 | Shabbir | .............. | H05K 7/20836 361/679.48 |
| 2015/0184883 A1* | 7/2015 | Hamann | ............. | H05K 7/20836 700/277 |
| 2016/0192543 A1* | 6/2016 | Matsuda | ............ | H05K 7/20736 165/246 |
| 2016/0368022 A1* | 12/2016 | Ohta | ...................... | C25D 13/22 |

FOREIGN PATENT DOCUMENTS

| | | |
|---|---|---|
| JP | 2010-43817 | 2/2010 |
| JP | 2011-7423 | 1/2011 |
| JP | 2011-94899 | 5/2011 |
| JP | 2011-242008 | 12/2011 |
| JP | 2013-15314 | 1/2013 |

* cited by examiner

AIR-CONDITIONING APPARATUS

CROSS REFERENCE TO RELATED APPLICATIONS

This application is a continuation application of International Application PCT/JP2014/072315 filed on Aug. 26, 2014 and designated the U.S. The International Application claims the benefit of Japanese Application No. 2013-190362 filed Sep. 13, 2013, the entire contents of which are incorporated herein by reference.

FIELD

The embodiments discussed herein are related to an air-conditioning apparatus for an air-conditioning target space in which a heat-producing object such as a server apparatus etc. is installed.

BACKGROUND

Many computers (server apparatuses etc.) have conventionally been installed in for example a data center, a server room of a company, etc. Server apparatuses etc. are heat-producing objects during their operation. In a server room etc., heat produced by many server apparatuses etc. increase the ambient temperature, leading to a possibility that the increased temperature causes the server apparatuses etc. to fail. Accordingly, a cooling target space such as a server room etc. is provided with an air-conditioning system that keeps a constant temperature in the entire room. Air-conditioning systems such as this basically operate throughout the year, including winter.

An air-conditioning system such as this causes return air from for example a cooling target space to flow into the air-conditioning device so as to cool the return air in the air-conditioning device so that it becomes cold air, and supplies this cold air to the cooling target space. A rack group for example is installed in the cooling target space, and server apparatuses etc. are set in the respective racks. Each server apparatus is provided with a compact fan so that the cold air is inhaled into the server apparatus by the compact fan in order to cool the server apparatus.

The cold air is heated while it cools the server apparatuses, and becomes warm air. This warm air is discharged from the server apparatuses etc. or the racks and is discharged from the server room etc. as the above return air. The return air discharged from the server room etc. is cooled by the air-conditioning device to become cool air again, and is supplied to the server room etc. Alternatively, there is a configuration in which return air is discharged as exhausted air to the outside.

There is conventional technology disclosed by for example Patent Documents 1 and 2, etc. for the above air-conditioning system for a server room etc.

For example, there is conventional technology that uses a rack, for accommodating a server apparatus, including a front plane for inhaling cold air and an upper or rear plane for discharging return air in order to provide a recirculation preventive device for preventing the return air from recirculating to the front plane (Patent Document 1 for example). The conventional technology disclosed by Patent Document 1 can fix a closure shield to the upper plane of the rack so as to prevent the returned air from mixing with the cold air so that the cold air can be used effectively.

There is also conventional technology that includes a differential pressure sensor for measuring the differential pressure between the cold area and the hot area, controls an air blower on the basis of the measured value of this differential sensor, and thereby keeps the pressure in the cold area always higher than the pressure in the hot area (Patent Document 2 for example). Thereby, return air is prevented from recirculating to the cold area.

Patent document 1: Japanese Laid-open Patent Publication No. 2005-260148
Patent document 2: Japanese Laid-open Patent Publication No. 2011-242008

SUMMARY

According to an aspect of the embodiments, an air-conditioning apparatus is an air-conditioning apparatus, for an air-conditioning target space in which a rack including a device as a heat-producing object is provided and which is separated by the rack into a cold space and a hot space, that makes return air from the hot space flow in so as to cool the return air and supplies an arbitrary air volume of the supplied air which is obtained by cooling the return air to the cold space by using a supply fan. The air-conditioning apparatus includes a processor. The processor executes a process including conducting control so that a temperature of the supplied air is equal to a prescribed value that is set in advance, and adjusting an air volume of the supplied air by controlling the supply fan so that a temperature of the return air is equal to a target value that is set in advance.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

An air-conditioning apparatus of a general refrigerating cycle is provided with a compressor, whereas an indirect outside-air cooling device is not provided with a compressor. Accordingly, indirect outside-air cooling device is basically used under a circumstance in which the temperature of the outside air is lower than that of the cooling target air (return air). There is also a case where an indirect outside-air cooling device is provided to perform a supplementary function for an air-conditioning device of a general refrigerating cycle (referred to as a general-type air-conditioning device, hereinafter). In other words, a hybrid-type air-conditioning apparatus that includes both an indirect outside-air cooling device and a general-type air-conditioning device is also known. A hybrid-type air-conditioning apparatus such as the above first cools the return air by using the indirect outside-air cooling device to a lower temperature, and thereafter cools the air by using the general-type air-conditioning device so as to generate cold air.

In any case, for an indirect outside-air cooling device to function, an outside air temperature that is lower than the return air is a fundamental condition. Further, when the efficiency is taken into consideration, it is desirable that the return air temperature is high to some extent. For example, the return air temperature of about 30° C. in a case of the outside air temperature of 25° C. leads to a too small temperature difference from the outside air, leading to poor cooling efficiency based on the outside air, and accordingly it is desirable for example that the return air temperature be about 37° C.

Also, for example the temperature and the volume of cold air supplied from the air-conditioning device to the cooling target space is set to a prescribed value that is set in advance. In other words, the temperature and the volume of cold air has been set to be constant regardless of the load status of the server apparatus etc., which is the cooling target. However, regarding the air volume, the actual air volume is not measured by an air volume meter etc., and the number of revolutions of the fan (not illustrated) in the air-conditioning device is controlled so that it corresponds to a prescribed air volume that is set in advance.

Regarding compact fans included in server apparatuses, the number of revolutions is set to increase or decrease in accordance with the loads (amount of produced heat) on the server apparatuses in some cases. Note that in the following explanations, only compact fans in server apparatuses are exemplified. When large loads are on server apparatuses, i.e., when the server apparatuses are producing a large amount of heat, the number of revolutions of the compact fans in the server apparatuses is increased so as to make a larger volume of cold air pass through the server apparatuses. When small loads are on the server apparatuses, i.e., when the server apparatuses are producing a small amount of heat, the number of revolutions of the compact fans in the server apparatuses is decreased so as to make a smaller volume of cold air pass through the server apparatuses.

However, this type of control is not always conducted, and the control of an air-conditioning device and the fan control for the server apparatuses are often independent from each other in actuality, often leading to a situation where the air-conditioning device side does not recognize the behavior of the compact fans in the server apparatuses. It is in actuality at least difficult to control the fan air volume of the air-conditioning device and the fan air volume of the compact fans in the server apparatuses in a coordinated manner.

However, by controlling the number of revolutions of the fan in an air-conditioning device, the volume of the air passing through the server apparatuses etc. (which is almost equal to the air volume of the return air) can be controlled to some extent. For example, when the number of revolutions of a compact fan in a server apparatus etc. is equivalent to "50" of the air volume and the air volume caused by the fan (supplied air volume) of an air-conditioning device is "100", the volume of the air passing through the server apparatus etc. is a value greater than "50" and smaller than "100". An example of this value is "80". However, it is not unclear whether the actual air volume in the rack is "80". In order to recognize the actual air volume in the server apparatus, for example an air volume meter etc. for measuring the volume of the return air is to be installed.

When the air volume in the server apparatus is smaller than an appropriate value that is in response to the loads on the server apparatus (the amount of heat produced by the server apparatus), the cooling of the server apparatus is insufficient. In view of this, when the volume of air supplied from the air-conditioning device is set to be constant, the supplied air volume has been set to a value in response to the state of 100% of the loads on the server apparatus. This is for preventing the insufficient cooling of the server apparatus regardless of the loads, while the loads on all servers in a rack do not often become 100%. Accordingly, in most cases, cold air is supplied to the server apparatuses excessively, which is problematic in view of the energy saving.

Further, when for example the total air volume based on compact fans in a rack is greater than the air volume supplied by the fan of the air-conditioning device, the cold area becomes negative pressure and the hot area becomes positive pressure in the configuration as illustrated in Patent Document 2. This cause the warm air in the hot area to flow into the cold area through a gap etc. Also for this reason, it is desirable that the volume of air supplied from the air-conditioning device be kept sufficient so that the cold area is positive pressure.

As a general rule, when an air volume becomes twice, the pressure loss becomes four times, leading to eight times of the power to be input to the fan because of "power to be input to the fan=air volume×pressure loss". When the loads on server apparatuses are low, the air volume supplied from for example the air-conditioning device may be half the above constant value, whereas because the above constant value is always employed, causing a problem in view of the energy saving.

Also, in a case when the above air volume is constant, lower loads on the server apparatuses lower the temperature of the return air, and this, particularly when the air-conditioning device is an indirect outside air-conditioning device, reduces the temperature difference between the outside air and the return air, resulting in lower efficiency in cooling the return air by the outside air.

The air-conditioning system described above makes constant the volume of the cold air supplied (supplied air) from the air-conditioning device and conducts control so that the temperature of the supplied air has a constant value. Note that a "constant value" used herein is a prescribed value that is determined and set in advance. Usually, an air volume meter is not provided, and accordingly the relationship between the number of revolutions of the fan in the air-conditioning device and the air volume is obtained in advance so as to operate the system with the number of revolutions equal to the prescribed value. Increase in the number of revolutions of the fan in the air-conditioning device increases the air pressure in the cold area. Accordingly, it is possible to prevent return air from entering the cold area by controlling the number of revolutions of the fan of the air-conditioning device in so that the air pressure in the cold area is slightly higher than the air pressure in the hot area.

However, when the capacity (air volume) of the compact fans in the rack is low, the above relationship of the air pressure is maintained even when the blown air volume of the air-conditioning device is small, leading to a situation where the air volume of the cold air passing through the rack is insufficient and the server apparatuses are heated. For example, the number of revolutions etc. of compact fans in the rack changes in response to the loads on the server apparatuses, whereas there can be a case where the number of revolutions of the compact fans in the rack does not increase for some reason even when the loads on the server apparatuses have increased.

However, even in the above situation, it is not problematic for technology for keeping the pressure in the cold area higher than the pressure in the hot area when the air pressure in the cold area is higher than that in the hot area, and accordingly the situation is left unaddressed. Note that when the number of revolutions of compact fans in a rack increases, the above relationship of the air pressure is not maintained, increasing the blown air volume of the air-conditioning device, and thereby the air pressure in the cold area increases and the volume of the air passing through the rack also increases.

Also, in the above situation, even when the number of revolutions of compact fans in the rack does not increase, the volume of the air passing through the rack can be increased by increasing the blown air volume of the air-conditioning device as described above.

Also, in the case of technology of keeping constant the blown air volume of the air-conditioning device, the number of revolutions of the fan of the air-conditioning device was to be set to be high in order to respond to the above described problem, which worked against the energy saving. In other words, the number of revolutions of the fan of the air-conditioning device was set for the case where for example the maximum loads are on the server apparatuses. Thereby, when for example the loads on the server apparatuses are high and the capacity of the fans in the rack is correspondingly large, the number of revolutions of the fan of the air-conditioning device is set for such a case as described above, and accordingly it was thought that there were no problems.

When for example the loads on the server apparatuses are low and the capacity of the fan in the rack is correspondingly small, the cold air flows excessively so as to cool the server apparatuses excessively, whereas this phenomenon itself is not problematic, and also in this case, the air pressure in the cold area becomes higher, whereas this phenomena itself is not problematic either. However, because the volume of the cold air is excessive, the power is consumed uselessly as a matter of course.

In order to solve the above problem, it is possible to provide a unit (air volume meter) that directly measure an air volume to the return-air channel of an air-conditioning device, while air volume meters themselves are bulky and costly, which is problematic.

In view of the above, it is made possible to reduce the power consumption and further to prevent return air from flowing into the cold space by controlling the supplied air volume so that the return air temperature has a prescribed value.

Hereinafter, the embodiments of the present invention will be explained by referring to the drawings.

Figure 1:
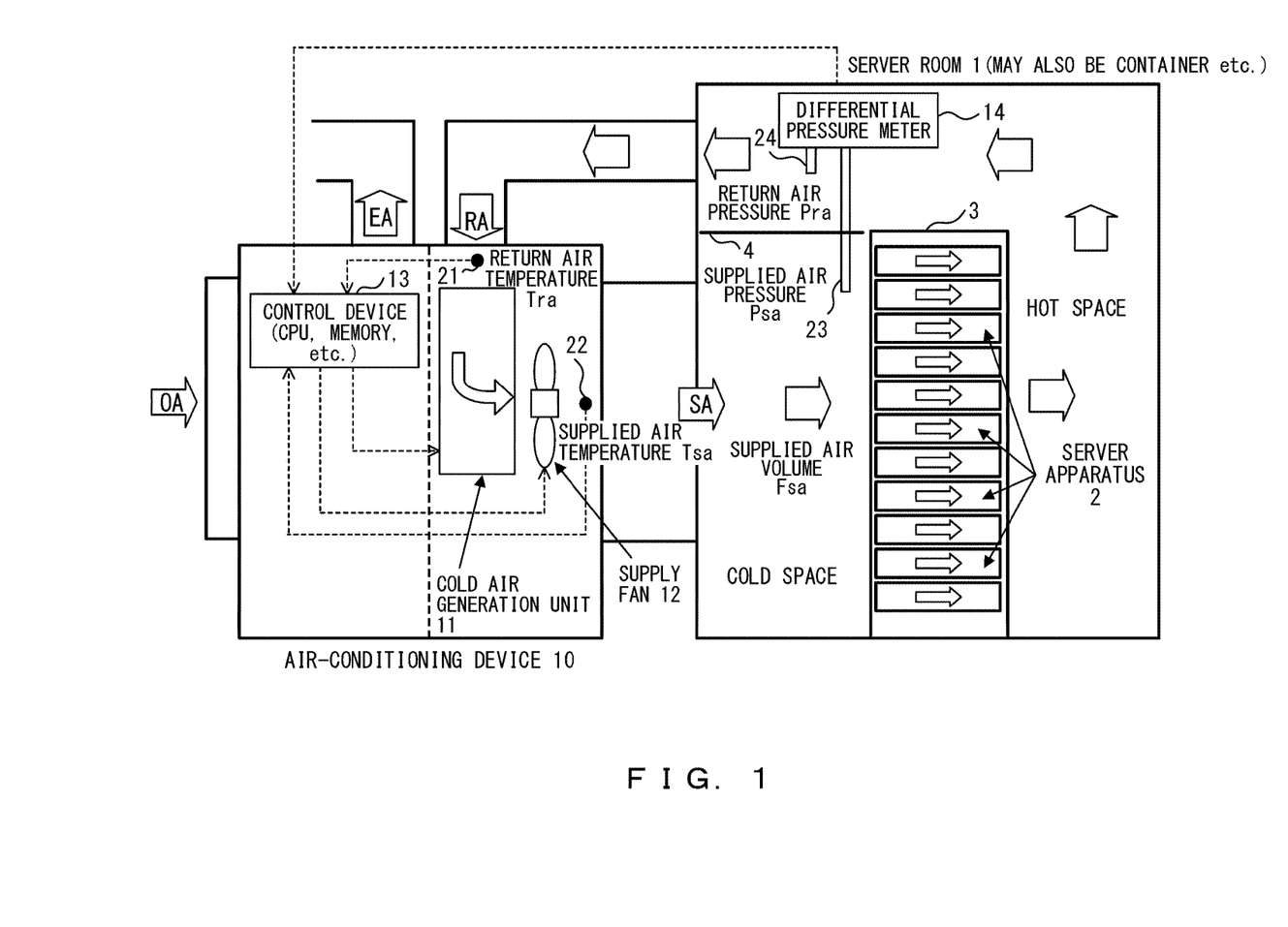
FIG. 1 illustrates an entire configuration of an air-conditioning device of the present example.

FIG. 1 illustrates an entire configuration of an air-conditioning device of the present example.

An air-conditioning device 10 of the present example may be for example an indirect outside-air cooling device as described above, may be a general-type air-conditioning device, or may be a hybrid-type air-conditioning apparatus including both the indirect outside-air cooling device and the general-type air-conditioning device, although the detailed configurations thereof will not be illustrated or described.

Note that a general-type air-conditioning device is an air-conditioning apparatus of a general refrigerating cycle as described above, and includes, as is known well, an evaporator, a compressor, a condenser, an expansion valve, etc., although they are not illustrated, and refrigerant circulates through these constituents. The above return air is cooled by the evaporator so as to become the above cold air. In the condenser, heat exchange occurs between the outside air and the refrigerant so that the refrigerant is cooled by the outside air.

Also, the indirect outside-air cooling device may have a conventional configuration including an indoor heat exchanger, an outdoor heat exchanger, a pump, pipes, etc., and the coolant (such as water etc.) circulates through the indoor heat exchanger and the outdoor heat exchanger, although this is not illustrated. The return air passes through the indoor heat exchanger so that the heat exchange occurs between the return air and the above coolant. Basically, the return air is cooled by the coolant. The outside air passes through the outdoor heat exchanger so that the heat exchange occurs between the outside air and the coolant. Basically, the coolant is cooled by the outside air.

The air-conditioning device 10 includes an indoor unit and an outdoor unit, with the indoor unit being provided with a cold air generation unit 11 and a supply fan 12 etc. The air-conditioning device 10 further includes a control device 13 etc. Note that the figure illustrates only some of the constituents of the air-conditioning device 10. In particular, the configuration of the outdoor unit is illustrated in a simplified manner. Note that the figure illustrates a configuration in which the control device 13 is provided to the outdoor unit, whereas the control device 13 can be installed in an arbitrary place.

Note that as a general rule, an indoor unit is installed in a building, while an outdoor unit is installed outside, whereas it is also possible to employ a configuration in which the indoor unit is also installed outside so as to supply, to the indoor unit, the return air discharged from the building and to supply air from the indoor unit to the building.

The cold air generation unit 11 is for example the above indoor heat exchanger of an indirect outside-air cooling device or the above evaporator etc. of a general-type air-conditioning device, and has a configuration of cooling return air as described above. The supply fan 12 flows return air RA of a server room 1 into the air-conditioning device 10 (the indoor unit thereof), cools this air by using the cold air generation unit 11 so as to make it cold air, and generates an air flow for supplying the cold air to the server room 1 as supplied air SA.

Note that, as the outdoor unit, outdoor heat exchanger, condenser, etc. described above (not illustrated), an outside-air fan etc. (not illustrated) are provided, whereas these components are not illustrated or explained. Also, the pump, pipes, compressor, expansion valve, etc. described above are not illustrated or illustrated.

The above outside-air fan (not illustrated) forms an air flow that inhales illustrated outside air OA to make the air pass through the above outdoor heat exchanger (not illustrated), the condenser, etc., and thereafter forms an air flow that discharges the air as exhausted air EA (illustrated). Note that, in the case of the hybrid-type air-conditioning apparatus, outside air OA is made to pass through the condenser after being made to pass through the outdoor heat exchanger.

The control device 13 controls the cold air generation unit 11, the pump, the compressor, etc. (not illustrated) so that the temperature of supplied air SA (cold air) (supplied air temperature Tsa) is equal to prescribed value $ST_{SA}$ that is set in advance. The configuration/control itself for making supplied air temperature Tsa constant is similar to the conventional technology, and further explanations will be omitted.

Also, the control device 13 controls the number of revolutions of the supply fan 12 so as to control the blown air volume of supplied air SA. Basically, the present technology controls the blown air volume of supplied air SA so that the temperature of the return air RA (return air temperature Tra) is equal to prescribed value $ST_{RA}$ that is set in advance. However, when differential pressure value $\Delta P(=Psa-Pra)$ between supplied air pressure Psa and return air pressure Pra has become lower than prescribed value $\Delta SP$, the blown air volume of supplied air SA is controlled so that differential pressure value $\Delta P$ is equal to or higher than prescribed value $\Delta SP$ with higher priority than priority given to the control of making return air temperature Tra equal to prescribed value $ST_{RA}$. In other words, during the execution of this control, it unnecessary for return air temperature Tra to be equal to prescribed value $ST_{RA}$. By instead making differential pressure value $\Delta P$ equal to or greater than prescribed value $\Delta SP$, priority is given to the avoidance of a situation where return air (warm air) enters the cold space. Note that when return air RA enters the cold space, there is a possibility that this return air RA is inhaled into a rack 3, preventing the cooling of the server apparatuses 2. Prescribed value $\Delta SP$ above is differential pressure setting value $\Delta SP$, which will be described later.

Note that above $ST_{SA}$ and $ST_{RA}$ are referred to as supplied air temperature setting value $ST_{SA}$ and return air temperature setting value $ST_{RA}$, etc.

Also, a temperature sensor 22 for measuring supplied air temperature Tsa, a temperature sensor 21 for measuring return air temperature Tra, differential pressure meter 14 for measuring differential pressure value $\Delta P$ between supplied air pressure Psa, which is the air pressure in the cold space, which will be described later, and return air pressure Pra, which is the air pressure in the hot space, a pipe 23 for connecting the cold space and the differential pressure meter 14, a pipe 24 for connecting the hot space and the differential pressure meter 14, etc. are also provided.

The arrows of dotted lines appearing in the figure represent signal lines. The differential pressure meter 14 is connected to the control device 13 via a signal line. Thereby, the measured value of the pressure difference (differential pressure) between the cold space and the hot space obtained by the differential pressure meter 14 is input to the control device 13.

While the present example uses the differential pressure meter 14, the scope of the present invention is not limited to this example. For example, it is also possible to use separate pressure sensors to measure supplied air pressure Psa and return air pressure Pra, input these measured values to the control device 13, and obtain the differential pressure on the basis of these measured values in the control device 13.

Also, as represented by the arrows of dotted lines in the figure, supplied air temperature Tsa measured by the temperature sensor 22 and return air temperature Tra measured by the temperature sensor 21 are also input to the control device 13. The control device 13 controls the number of revolutions of the supply fan 12 on the basis of return air temperature Tra, differential pressure value $\Delta P$, etc. In other words, supplied air volume Fsa is controlled. Note that control device 13 controls other constituents (not illustrated), while these constituents will not be illustrated or explained, as stated above.

In this example, the control device 13 includes a Central Processing Unit (CPU), a memory, etc., and the CPU executes a prescribed application program stored in the memory in advance so as to implement the control of the cold air generation unit 11, the number of revolutions of the supply fan 12, etc. The CPU is an example of a processor. Particularly, it implements the process in FIG. 2, which will be described later.

Also, the control device 13 has the function of beforehand prompting the user to set arbitrary supplied air temperature setting value $ST_{SA}$, return air temperature setting value $ST_{RA}$, differential pressure setting value $\Delta SP$, which will be described later, etc. so as to store these setting values in the above memory.

The control itself of making supplied air temperature Tsa equal to setting value $ST_{SA}$ is implemented by the process of controlling the number of revolutions of the compressor (not illustrated) in the air-conditioning device 10 and the flow rate of the refrigerant as in the conventional technology, and this control process itself will not be explained.

Also, the above control of making return air temperature Tra equal to prescribed value $ST_{RA}$ is implemented by controlling the number of revolutions of the supply fan 12 of the air-conditioning device 10.

In the present technology, the differential pressure meter 14 measures differential pressure value $\Delta P(=Psa-Pra)$ between supplied air pressure Psa and return air pressure Pra on an as-needed basis. When this differential pressure value $\Delta P$ is lower than differential pressure setting value $\Delta SP$, the supplied air volume control is conducted so as to make differential pressure value $\Delta P$ equal to or higher than differential pressure setting value $\Delta SP$ with higher priority than that given to the control of making return air temperature Tra equal to prescribed value $ST_{RA}$. This basically means that control is conducted so as to increase the blown air volume of supplied air SA by increasing the number of revolutions of the supply fan 12 of the air-conditioning device 10 in order to increase the air pressure in the cold space. In such a case, there is a high possibility that the volume of the air passing through the rack 3 increases so as to decrease return air temperature Tra, while it is not treated as a problem that return air temperature Tra is lower than prescribed value $ST_{RA}$ in that situation. Instead, priority is given to increasing of the air pressure in the cold space so as to prevent the return air from entering the cold space.

Note that the number of revolutions of the supply fan 12 increases/decreases by a prescribed amount that is for example set in advance, while the scope of the present invention is not limited to this example.

Herein, explanations will be given for differential pressure value $\Delta P$ and differential pressure setting value $\Delta SP$.

First, explanations will be given for the server room 1, which is an example of the cooling target space.

The server room 1 is provided with the rack 3 accommodating the plurality of server apparatuses 2. Note that the server apparatus 2 is an example of a device that produces heat during its operation, whereas the scope of the present invention is not limited to this example. Note that a device that produces heat during its operation produces various amounts of heat, and may produce an amount of heat in response to for example the current loads (load factor).

Also, usually, a plurality of the racks 3 exist and often form a rack line, although this is not illustrated in the figure. The space in the server room 1 is divided by the rack 3 itself and an illustrated closure plate 4 into the illustrated cold and hot spaces. However, this division does not provide complete separation and accordingly the return air (warm air) in the hot space may flow into the cold space.

The air-conditioning device 10 supplies an arbitrary blown air volume of supplied air SA (cold air) to the cold space. In the rack 3 and the server apparatus 2, compact fans (not illustrated) are provided, and the cold air in the cold space is inhaled by these compact fans into the rack 3 and the server apparatuses 2 so as to cool the server apparatuses 2 etc. while passing through the rack 3 and the server apparatuses 2, becomes warm air with an increased temperature, and is discharged from the rack 3 to the hot space. This warm air flows into the air-conditioning device 10 as return air RA. It is assumed in this example that the cold air is inhaled into the rack 3 from the front plane of the rack 3 and the warm air is discharged to the hot space from the rear plane of the rack 3.

Now, the difference (differential pressure value $\Delta P$=Psa−Pra) between supplied air pressure Psa and return air pressure Pra is obtained from the differential pressure meter 14 to which the pipes 23 and 24 are connected, supplied air pressure Psa being the air pressure in the cold space and return air pressure Pra being the air pressure in the hot space.

Figure 2:
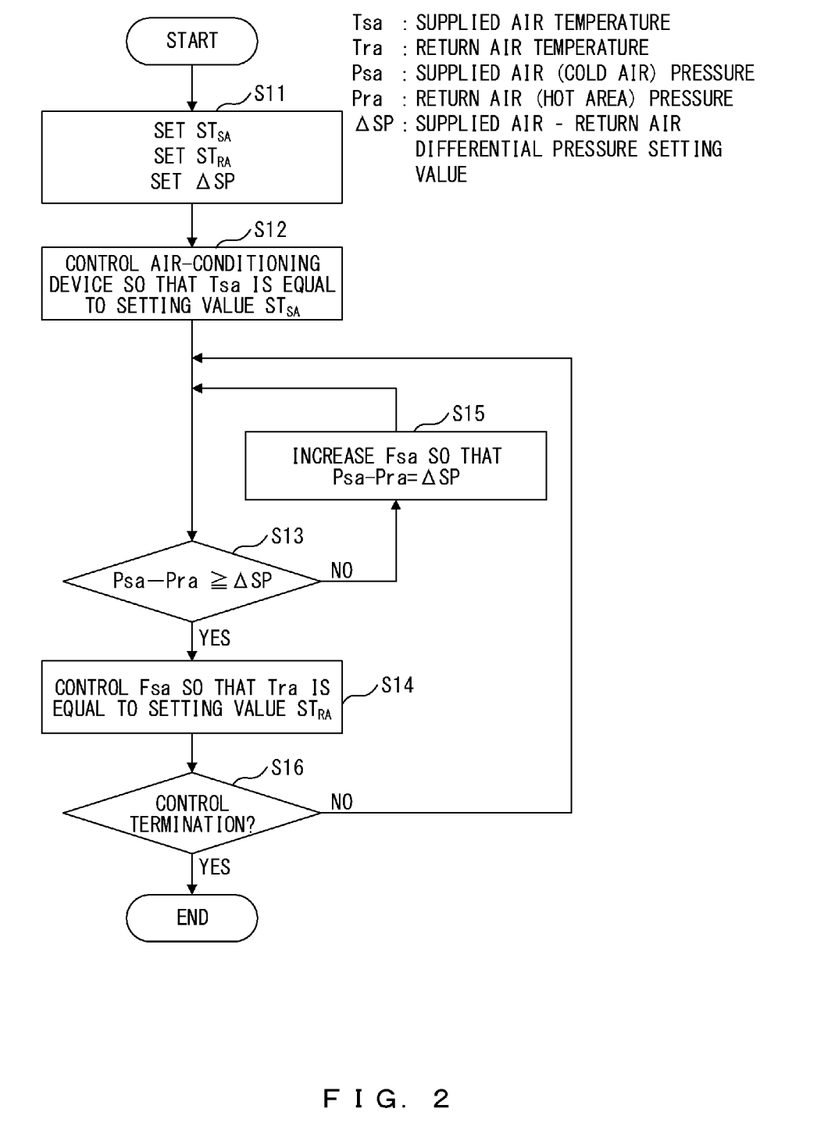
FIG. 2 illustrates a flowchart of process performed by a control device.

On the basis of differential pressure value $\Delta P$ obtained by the differential pressure meter 14 and differential pressure setting value $\Delta SP$ set in advance, the control device 13 executes for example the determination process in step S13, which will be described later, and processes etc. in response to the determination result. Detailed explanations will be given later for them.

FIG. 2 illustrates a flowchart of the process performed by the control device 13.

In the example illustrated in FIG. 2, the user etc. has been prompted to arbitrarily set supplied air temperature setting value $ST_{SA}$, return air temperature setting value $ST_{RA}$, differential pressure setting value $\Delta SP$, etc., and these setting values are stored in a memory etc. (step S11). Note that the control device 13 may include a configuration that allows the user etc. to set/input arbitrary data, although this is not illustrated.

During the operation, existing control of making supplied air temperature Tsa equal to setting value $ST_{SA}$ is conducted (step S12) as-needed basis, whereas this will not be explained particularly.

Also, during the operation, basically and on an as-needed basis, control of adjusting the number of revolutions of the supply fan 12 (supplied air volume Fsa) is conducted so that return air temperature Tra is equal to setting value $ST_{RA}$ (step S14). As a schematic example, the number of revolutions of the supply fan 12 is increased or decreased gradually so that return air temperature Tra becomes closer to setting value $ST_{RA}$, although this process will not be described in detail.

Also, during the operation and on an as-needed basis, whether differential pressure value $\Delta P$(=Psa−Pra) is equal to or greater than differential pressure setting value $\Delta SP$ is determined (step S13). When $\Delta P \geq \Delta SP$, the destination result in step S13 is Yes.

As long as the determination result in step S13 is Yes, the process in step S14 continues to be performed. However, when a situation where the determination result in step S13 is No has started, i.e., when differential pressure value $\Delta P$ has become lower than differential pressure setting value $\Delta SP(\Delta P<\Delta SP)$ (No in step S13), the mode proceeds to a mode in which the process in step S15 is executed.

In step S15, the number of revolutions of the supply fan 12 (supplied air volume Fsa) is controlled so that differential pressure value $\Delta P$ is equal to differential pressure setting value $\Delta SP$ (so that $\Delta P=\Delta SP$) or so that differential pressure value $\Delta P$ is equal to or greater than differential pressure setting value $\Delta SP$ (so that $\Delta P \geq \Delta SP$). This basically increases the number of revolutions the supply fan 12 (supplied air volume Fsa) gradually. Also, when the process has made differential pressure value $\Delta P$ equal to or greater than differential pressure setting value $\Delta SP$ ($\Delta P=\Delta SP$ or $\Delta P \geq \Delta SP$) (Yes in step S13), the mode returns to the execution mode of the process in step S14.

As described above, by increasing supplied air volume Fsa in step S15, the volume of the air passing through the rack 3 increases, resulting in lower return air temperature Tra even when there is no change in the air volume from the compact fan in the rack 3.

Also, when $\Delta SP=0$ and the air pressure in the hot space has become greater than the air pressure in the cold space, the destination result in step S13 becomes No. In this situation, because the return air (warm air) in the hot space flows into the cold space, the air pressure in the cold space is increased by increasing supplied air volume Fsa so as to solve this situation.

It is desirable that the user determine and set, as return air temperature setting value $ST_{RA}$ etc., the value that is believed to result in "the maximum efficiency of the air-conditioning device 10 without causing the server apparatuses to fail".

The process in FIG. 2 continues to be executed until it is determined that the control is terminated (Yes in step S16). Note that when for example the user makes a control termination instruction manipulation, the determination result in step S16 becomes Yes, whereas the scope of the present invention is not limited to this example.

Figure 3A:
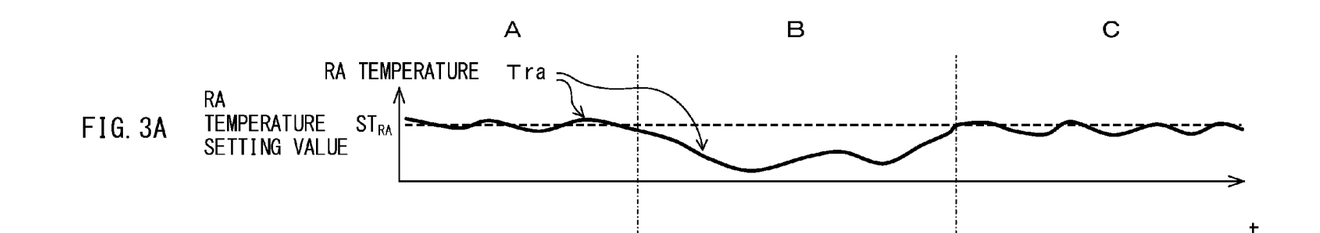
FIGS. 3A-3C illustrate specific examples of a return air temperature, a differential pressure and a number of revolutions of the fan.
Figure 3B:
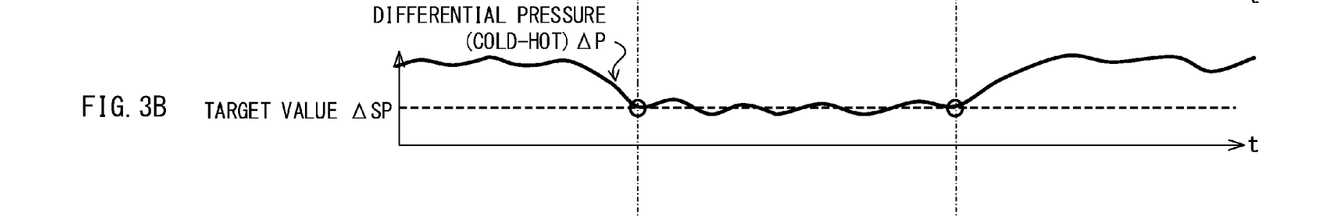
Figure 3C:
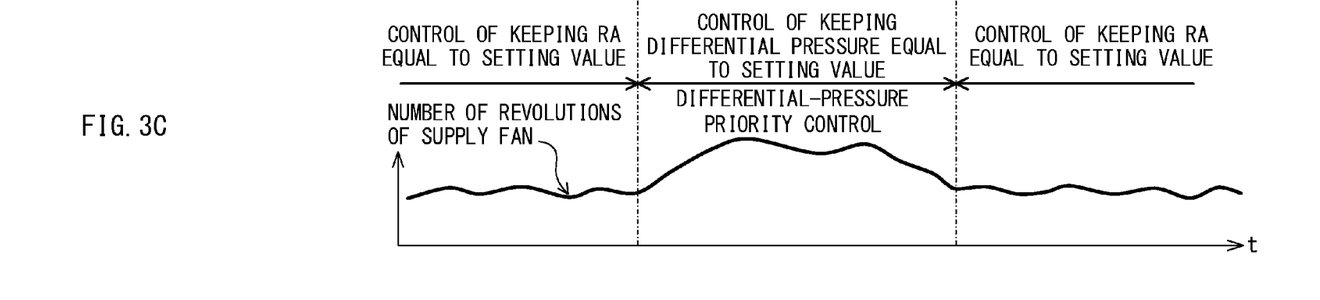

FIGS. 3A-3C illustrate specific examples of various values for the process illustrated in FIG. 2. FIG. 3A through FIG. 3C illustrate specific examples of return air temperature Tra, differential pressure value $\Delta P$ and the number of revolutions of the supply fan 12 (supplied air volume Fsa), respectively. Through these figures, the horizontal axes represent time, and are divided into three time ranges A through C in the left, center and right of the graphs.

Time range A on the left is a time range in which the process in step S14 was performed. Accordingly, in time range A, return air temperature Tra is roughly identical to setting value $ST_{RA}$ as illustrated in FIG. 3A. Also, in this time range A, when differential pressure value $\Delta P$ has decreased to become lower than $\Delta SP$ for some reason as illustrated in the figure, the determination result in step S15 becomes No, and the mode changes to a mode where the process in step S15 is executed.

Thereby, as illustrated in for example time range B at the center of the figure, the number of revolutions of the supply fan 12 (supplied air volume Fsa) increases (FIG. 3C) and thereby return air temperature Tra becomes lower than setting value $ST_{RA}$ (FIG. 3A). This means that excessive cold air is supplied to the server apparatuses 2, whereas this does not mean lack of cooling and is not particularly problematic. Also, this excessive supply is temporary, and thus is not particularly problematic in view of the energy saving.

Note that regarding differential pressure value $\Delta P$ in time range B, it is also possible to employ a configuration in which $\Delta P \approx \Delta SP$ is kept almost all during time range B for example in addition to the example illustrated in FIG. 3B and $\Delta P \geq \Delta SP$ is satisfied at the last timing in time range B, and thereby the same control mode (execution mode in step S14) as in time range A is used again in time range C.

Figures 4A, 4B, 4C, 4D:
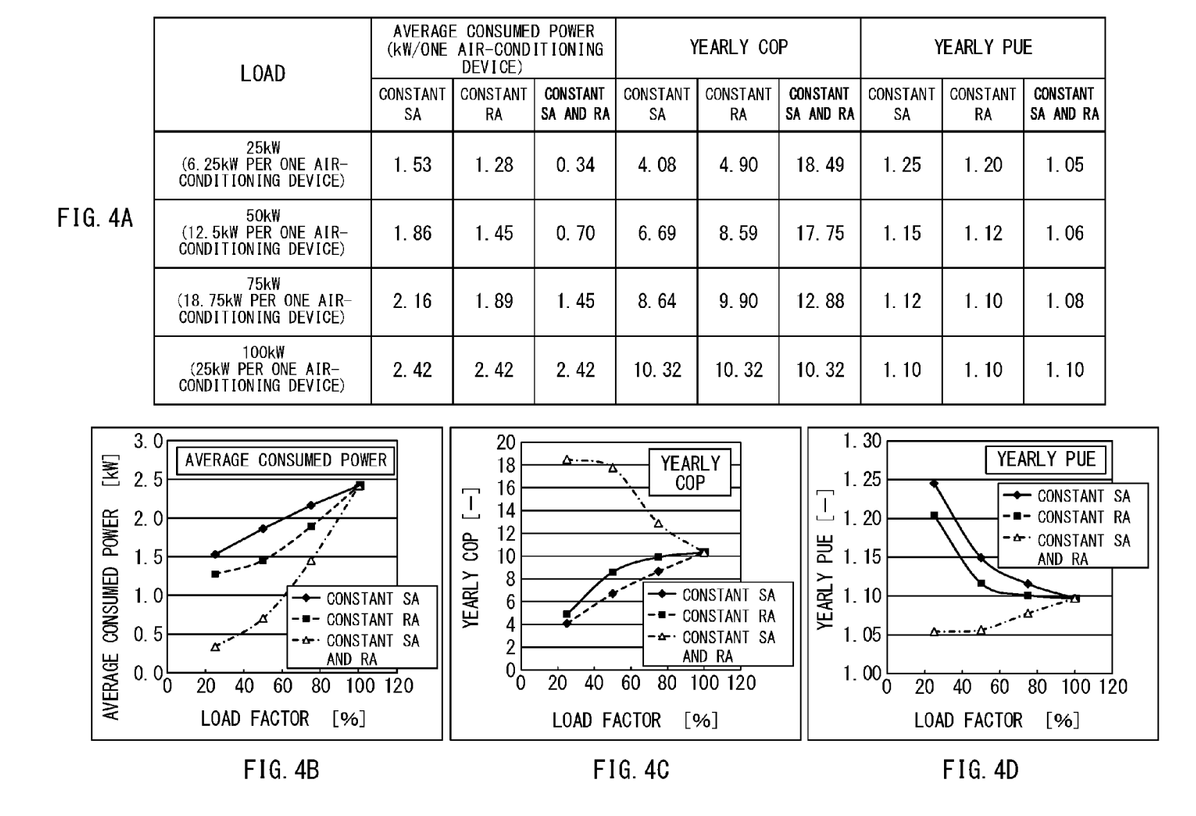
FIGS. 4A-4D illustrate consumed power of air-conditioning devices, etc.

The features of indirect outside air air-conditioning devices based on a conventional method, the present method, etc. are illustrated in FIG. 4A. They are estimated values based on calculations. FIG. 4B through FIG. 4D illustrate graphs of such features.

The features are basically average consumed power, and this example illustrates average consumed power per one indirect outside air air-conditioning device in a circumstance where four such indirect outside air air-conditioning devices are used. Further, the yearly COP (Coefficient Of Performance) and yearly PUE(−1+1/COP) are calculated and illustrated on the basis of the average consumed power. Note that the calculation is based on COP=cooling capacity/consumed power.

A conventional method is a method of "constant SA" illustrated in the figure. A constant SA method is a method in which the SA air volume (supplied air volume Fsa) is always constant (a value set in advance) and the amount of supplied refrigerant etc. is controlled so that SA temperature (supplied air temperature Tsa) is always equal to the target value (setting value) regardless of the loads.

Also, as described above, the present method is almost similar to the conventional technology in that control is conducted so that SA temperature (supplied air temperature Tsa) is always equal to the target value (supplied air temperature setting value $ST_{SA}$) regardless of the loads, whereas the present method is basically a method in which SA air volume (supplied air volume Fsa) is controlled so that RA temperature (return air temperature Tra) is always equal to the target value (return air temperature setting value $ST_{RA}$).

In addition to the conventional method and the present method, a method of "constant RA" illustrated in the figure is further described for the sake of comparison.

A constant RA method is a method in which the SA air volume (supplied air volume Fsa) is always constant (setting value) and the amount of supplied refrigerant etc. is controlled so that the RA temperature (return air temperature Tra) is always equal to the target value (setting value) regardless of the loads.

In the example illustrated in FIGS. 4A-4D, the temperature of the supplied air SA, the temperature of return air RA and the SA air volume (supplied air volume Fsa) are respectively set to 27° C., 37° C. and 7450 (m³/h) as the rated conditions in the case where the load factor is 100%. Note that, in the convention method, because the SA air volume is constant regardless of the loads, the SA air volume is 7450 (m³/h) even when the load factor is 25% or 50%. By contrast, in the present method, when for example the load factor is 50%, the SA air volume is 50% of 7450 (m³/h) in view of calculation.

Note that a load factor represents the load state (operation state) of a cooling target (server apparatus 2 etc.) and the state in which the server apparatuses 2 etc. are operating with their maximum capacity may be considered to be the load factor of 100%.

The average consumed power was obtained respectively for four load states, specifically a state with the load of 100 kW (load factor of 100%), a state with the load of 75 kW (load factor of 75%), a state with the load of 50 kW (load factor of 50%) and a state with the load of 25 kW (load factor of 25%).

FIG. 4A illustrates the average consumed power per one indirect outside air air-conditioning device. FIG. 4B illustrates a graph of this average consumed power.

As illustrated in FIG. 4B, when the load factor is 100%, the conventional method, the present method and the constant RA method have the same average consumed power. A comparison between the conventional method and the present method indicates that the smaller the load factor is, the greater the difference of the average consumed power is between these methods. In the conventional method, the SA air volume is constant and this air volume is set to be able to respond also to the load factor of 100%, and accordingly the air volume becomes relatively large, leading to greater consumed power. However, as described above, this air volume is in response to the load factor of 100%, and thus it is thought that the present method is also to use a substantially similar air volume when the load factor is 100%. Thus, as indicted in the figure, it is assumed that the conventional method and the present method have the same average consumed power in view of the calculation when the load factor is 100%.

In the present technology by contrast, it is expected that a smaller load factor basically reduces the SA air volume (supplied air volume Fsa). Also, because the return air temperature does not change regardless of the load states of the server apparatuses 2, the cooling efficiency is not deteriorated by the outside air. Accordingly, in the present technology, the average consumed power is smaller than that in the conventional technology as illustrated in FIG. 4B.

In the conventional technology by contrast, the SA air volume (supplied air volume Fsa) is not changed by a smaller load factor, and accordingly the conventional technology results in average consumed power that is larger than the present technology, although other factors may slightly reduce the average consumed power. Note that other factors described above may include, among others, control of reducing the amount of supplied refrigerant in response to changes in the loads.

Also, as illustrated in FIG. 4B, in the above "constant RA" method, it is indicated that the average consumed power is smaller than the conventional method while it is greater than the present method and that the present method results in smaller average consumed power when the load factor is low particularly when for example the load factor is equal to or lower than 60%. This is because a lower load factor does not change the SA air volume (supplied air volume Fsa) even in the "constant RA" method as described above, leading to a situation where the lower the load factor is, the greater the difference in the SA air volume is between the present method and the SA air volume.

Note that the yearly COPs illustrated in FIG. 4A and FIG. 4C are calculated on the basis of the average consumed power, and accordingly the value based on the present method is the best naturally. Note that the greater a value of a COP is, the better that COP is.

Similarly, the yearly PUEs illustrated in FIG. 4A and FIG. 4D are calculated on the basis of the average consumed power, and accordingly the value based on the present method is the best naturally. Note that the smaller a value of a PUE is, the better that PUE is.

Figure 5A:
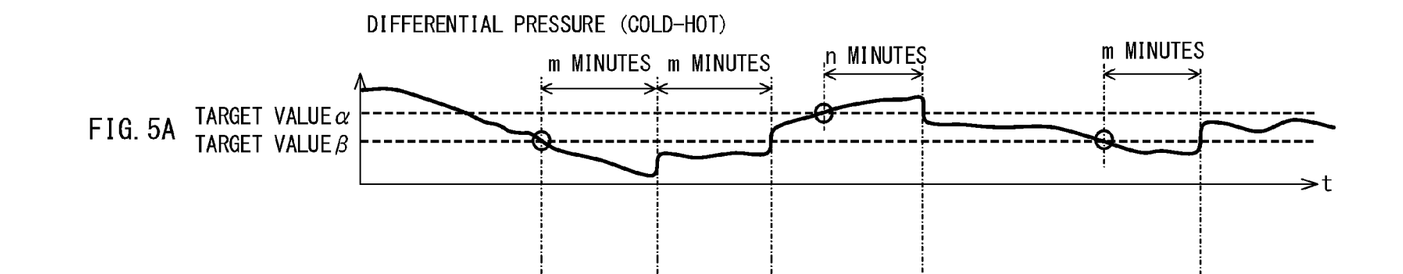
FIGS. 5A and 5B explain a second example.
Figure 5B:
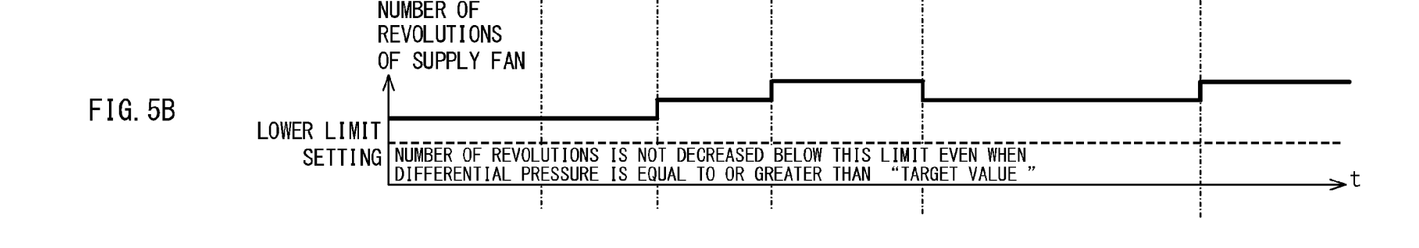

FIGS. 5A and 5B explain the second examples of the present technology.

The second example prevents a situation where "because the differential pressure is slight, violent changes in the magnitude relationship are caused, leading to unstable control".

As an example, the execution mode in step S14, the determination in step S13 above is also conducted in the second example, while when the determination state of Yes or NO has not continued for at least a period of time that is set in advance, the process in response to the Yes/No determination is not executed. In other words, in the execution mode in step S15, when a state in which the difference in the air pressure between the cold space and the hot space, i.e., the differential pressure value ΔP(=Psa−Pra), is equal to or greater than differential pressure setting value ΔSP, i.e., a state in which the determination in step S13 is Yes, has continued for at least a prescribed period of time (n minutes), the mode proceeds to the execution mode in step S14.

In the execution mode in step S15, by contrast, when a state in which differential pressure value ΔP is smaller than differential pressure setting value ΔSP, i.e., a state in which the determination result is No in step S13 above, has continued for at least a prescribed period of time (m minutes), the mode proceeds to the execution mode in step S15.

A method that treats the above "continuation for at least prescribed period of time" as a condition is treated as the first technology of the second example.

The following second or third technology can also be employed in addition to the above example.

The second technology in the second example prepares two types of differential pressure setting value ΔSP. In other words, it is also possible to employ two types of differential pressure setting value ΔSP; target values α and β for example as illustrated in FIG. 5A. Note in this example that α>β. Also, in this case, the control technology in the second technology of the second example is for example as below. It is assumed in the second technology that "m minutes" or "n minutes" illustrated in FIG. 5A is not used.

For example, when differential pressure value ΔP(=Psa−Pra) has become equal to or greater than target value α, the number of revolutions of the supply fan 12 (supplied air volume Fsa) is reduced from the current value by a prescribed amount (ΔFsa1).

Also, when differential pressure value ΔP(=Psa−Pra) has become smaller than target value β, the number of revolutions of the supply fan 12 (supplied air volume Fsa) is increased from the current value by a prescribed amount (ΔFsa2).

The third technology is a combination of the first technology and the second technology, and a specific example thereof will be illustrated in FIG. 5A and FIG. 5B.

In the third technology, when for example a state in which differential pressure value ΔP(=Psa−Pra) is equal to or greater than target value α has continued for at least a prescribed period of time (n minutes), the number of revolutions of the supply fan 12 (supplied air volume Fsa) is decreased from the current value by a prescribed amount. However, the number of revolutions of the supply fan 12 is controlled so that it does not become smaller than a lower limit value that is arbitrarily set in advance.

Also, when a state in which differential pressure value ΔP(=Psa−Pra) is smaller than target value β has continued for at least a prescribed period of time (m minutes), the number of revolutions of the supply fan 12 (supplied air volume Fsa) is increased from the current value by a prescribed amount.

As illustrated in FIG. 5A and FIG. 5B, the number of revolutions of the supply fan 12 is not increased immediately when for example differential pressure value ΔP has become smaller than target value β, but the number of revolutions of the supply fan 12 is increased when such a situation has continued for m minutes.

According to the second example, great changes in the differential pressure accompanying the elapse of time does not greatly change the number of revolutions of the supply fan 12, making it possible to prevent the hunting and divergence caused by the self excitation.

It is also possible to reset the continued period of time that has been measured when the control of increasing/decreasing supplied air volume Fsa is conducted and start the new measurement in the third technology of the second example. In other words, when for example a state in which differential pressure value ΔP is smaller than target value β has continued for m minutes, supplied air volume Fsa is increased, while when the state in which differential pressure value ΔP is smaller than target value β also continues after that, it is checked whether that state continues again for m minutes by measuring the elapsed time, and supplied air volume Fsa is further increased when it has continued for m minutes. FIGS. 5A and 5B illustrate an example in which this control increased supplied air volume Fsa and thereafter further increased it after m minutes.

Figure 6:
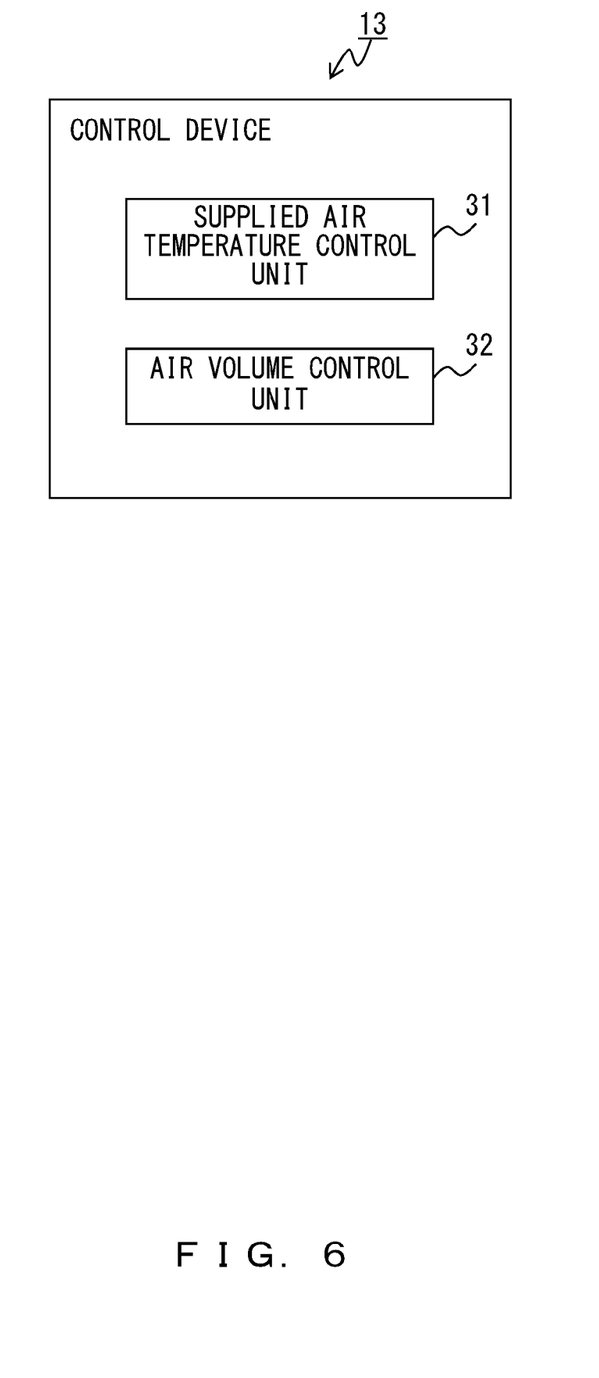
FIG. 6 is a functional block diagram of a control device.

From what has been described above, it is also possible to consider that the control device 13 includes the respective processing function units illustrated in for example FIG. 6. FIG. 6 is a functional block diagram of the control device 13.

In other words, the control device 13 includes a supplied air temperature control unit 31 that controls the temperature of the cold air (supplied air temperature Tsa) so that it is equal to prescribed value $ST_{SA}$ and an air volume control unit 32 that adjusts and controls the air volume of the supply fan 12 so that the temperature of the return air is equal to target value $ST_{RA}$ that is set in advance.

Also, when for example differential pressure value ΔP between the cold space and the hot space is smaller than differential pressure setting value ΔSP, the air volume control unit 32 controls the air volume of the supply fan 12 so that differential pressure value ΔP above is equal to or greater than differential pressure setting value ΔSP above regardless of (or with higher priority than that given to) whether the return air temperature is equal to the target value. In other words, the mode proceeds to the control mode of keeping the return air temperature constant to the control mode of making differential pressure value ΔP equal to or greater than differential pressure setting value ΔSP. Note that differential pressure setting value ΔSP may be for example zero or other values, and in such a case control is conducted so that the air pressure in the cold space does not become lower than that of the hot space.

It is also possible to treat first target value α and target value β smaller than that target value α as differential pressure setting value ΔSP.

Also, when for example differential pressure value ΔP has become smaller than second target value β, the air volume control unit 32 increases the air volume of the supply fan 12 by a prescribed amount. Also, when for example differential pressure value ΔP has become equal to or greater than first target value α, the air volume control unit 32 decreases the air volume of the supply fan 12 by a prescribed amount. Note that this prescribed amount is set arbitrarily in advance.

Alternatively, when for example a state in which differential pressure value ΔP is smaller than target value β has continued for a prescribed period of time (m minutes), the air volume control unit 32 increases the air volume of the supply fan 12 by a prescribed amount. Also, when for example a state in which differential pressure value ΔP is equal to or greater than first target value α has continued for a prescribed period of time (n minutes), the air volume control unit 32 decreases the air volume of the supply fan 12 by a prescribed amount. Note that this prescribed amount is arbitrarily set in advance. As a matter of course, this is an example of the above process and the scope of the present invention is not limited to this example.

Note that differential pressure setting value ΔSP, first target value α and second target value β serve as thresholds used for the air volume control of the supply fan 12 in the air volume control unit.

As described above, according to the present technology, the SA air volume (supplied air amount) is controlled so that the temperature of return air from the hot space is kept constant while keeping constant the temperature of the cold air supplied to the cold space. However, when the differential pressure between the cold space and the hot space has become lower than a threshold, the SA air volume is controlled so that differential pressure value ΔP is equal to or greater than differential pressure setting value ΔSP with higher priority than that given to the control of keeping the return air temperature constant.

The embodiment can provide an air-conditioning system that is able to solve the problem that "just keeping the differential pressure between the cold space and the hot space equal to or greater than a prescribed value may lead to an insufficient air volume, and setting an unnecessarily high value for the number of revolutions of the fan in order to prevent such a situation works against the energy saving", and able to perform energy-saving operations while preventing the return air from entering the cold space.

According to the present technology, it is not necessary to use uselessly energy for always keeping the air volume in response to the case with the highest server loads even when the server loads are low, which has conventionally been conducted, making it possible to control the air volume so that it is always an appropriate volume (minimal volume) in response to the current server loads etc., making energy-saving operations possible. Also, while the efficiency becomes lower due to a reduced temperature difference from the outside air when the return air temperature has become lower particularly in the case of an indirect outside-air cooling device, the present technology keeps the return air temperature constant basically, preventing the efficiency from becoming lower and thereby contributing to the energy saving.

Also, the present technology is a method of conducting control just by the pressure generated by an air flow and the air temperature increase caused by cooling server apparatuses, making it unnecessary to conduct complicated control of increasing the cooling capacity of the air-conditioning device of that section while monitoring the power consumption of the server apparatuses, leading to an advantage that electric measurement devices are not necessary.

According to the air-conditioning device etc. of the embodiment, it is possible to reduce the power consumption by controlling the supplied air volume so that the return air temperature is equal to a prescribed value and further to prevent the return air from entering the cold space.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An air-conditioning apparatus, for an air-conditioning target space in which a rack including a server apparatus is provided and which is separated by the rack into a cold space and a hot space, that makes return air from the hot space flow in so as to cool the return air and supplies supplied air which is obtained by cooling the return air to the cold space by using a supply fan, the air-conditioning apparatus comprising;

a differential pressure meter that measures a differential pressure between the cold space and the hot space; and a processor that conducts control so that a temperature of the supplied air is equal to a prescribed value that is set in advance and adjusts an air volume of the supplied air by controlling the supply fan so that a temperature of the return air is equal to a target value that is set in advance and the differential pressure is equal to or higher than a threshold with higher priority than priority given to the controlling the supply fan so that the temperature of the return air is equal to the target value when the differential pressure is lower than the threshold.

2. The air-conditioning apparatus according to claim 1, wherein the threshold includes a first threshold and a second threshold that is smaller than the first threshold, and the processor increases an air volume based on the supply fan by a prescribed amount when the differential pressure has become lower than the second threshold, and decreases an air volume based on the supply fan by a prescribed amount when the differential pressure has become equal to or higher than the first threshold.

3. The air-conditioning apparatus according to claim 1, wherein the threshold includes a first threshold and a second threshold that is smaller than the first threshold are treated as the threshold, and the processor increases an air volume based on the supply fan by a prescribed amount when a state in which the differential pressure is lower than the second threshold has continued for at least a prescribed period of time, and decreases an air volume based on the supply fan by a prescribed amount when a state in which the differential pressure is equal to or higher than the first threshold has continued for at least a prescribed period of time.

* * * * *